United States Patent [19]

Nishizaka et al.

[11] Patent Number: 5,593,904
[45] Date of Patent: Jan. 14, 1997

[54] METHOD FOR MANUFACTURING NAND TYPE SEMICONDUCTOR MEMORY DEVICE

[75] Inventors: Teiichiro Nishizaka; Kazutaka Otsuki, both of Tokyo, Japan

[73] Assignee: NEC Corporation, Tokyo, Japan

[21] Appl. No.: 451,548

[22] Filed: May 26, 1995

[30]     Foreign Application Priority Data

May 26, 1994   [JP]   Japan .................................. 6-134884

[51] Int. Cl.$^6$ ................................................ H01L 21/8246
[52] U.S. Cl. .................... 437/29; 437/48; 437/149
[58] Field of Search ........................ 437/29, 48, 50,
                              437/149, 150, 153, 154; 148/DIG. 9

[56]           References Cited

U.S. PATENT DOCUMENTS

| 4,914,047 | 4/1990 | Seki | 437/29 |
|---|---|---|---|
| 5,171,705 | 12/1992 | Choy | 437/150 |
| 5,397,723 | 3/1995 | Shirota et al. | 437/48 |
| 5,429,968 | 7/1995 | Koyama | 437/48 |

OTHER PUBLICATIONS

N. Rovedo etal., "Process Design for Merged Complementary BiCMOS", *IEDM Technical Digest*, 1990, pp. 485–488.

*Primary Examiner*—Chandra Chaudhari
*Attorney, Agent, or Firm*—Sughrue, Mion, Zinn, Macpeak & Seas

[57]            ABSTRACT

A plurality of gate electrodes are formed over a semiconductor substrate of a first conductivity type, and impurities of a second conductivity type are introduced into the substrate with a mask of the gate electrodes, to form source/drain impurity regions. Then, an insulating pattern is formed on the gate electrode and the source/drain impurity regions, and impurities of the second conductivity type are introduced into the substrate with a mask of the insulating pattern, to form a deep base region which is connected to one of the source/drain impurity regions. Also, impurities of the first conductivity type are introduced into the substrate with a mask of the insulating pattern, to form a shallow emitter region.

9 Claims, 18 Drawing Sheets

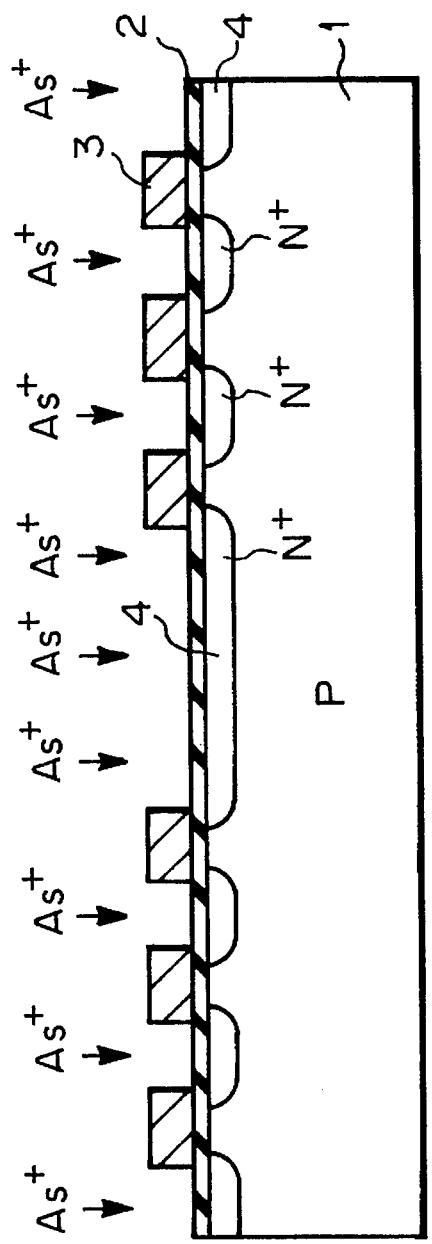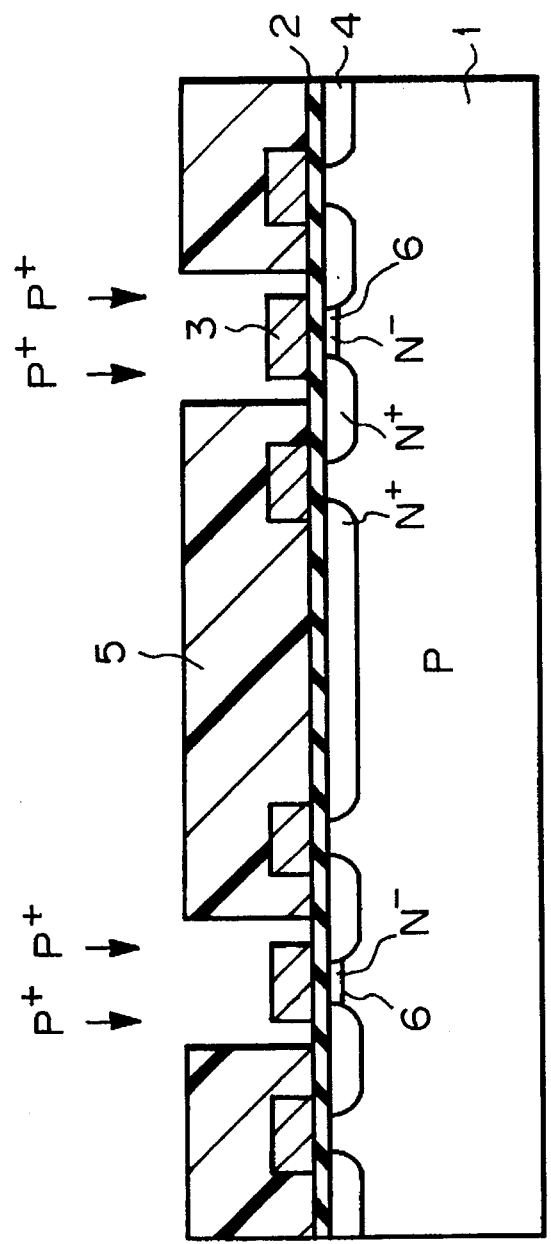
Fig. 2A PRIOR ART
Fig. 2B PRIOR ART

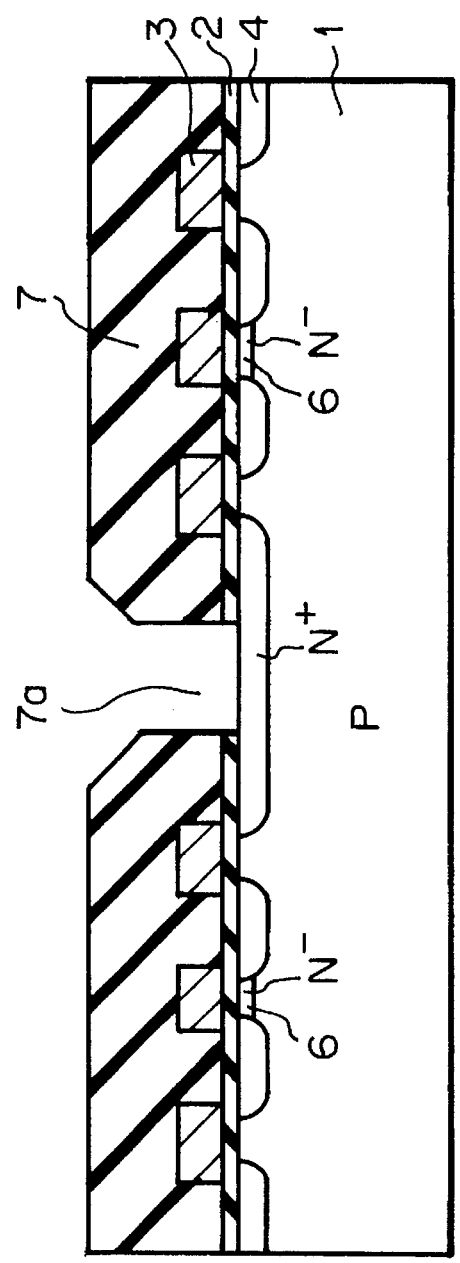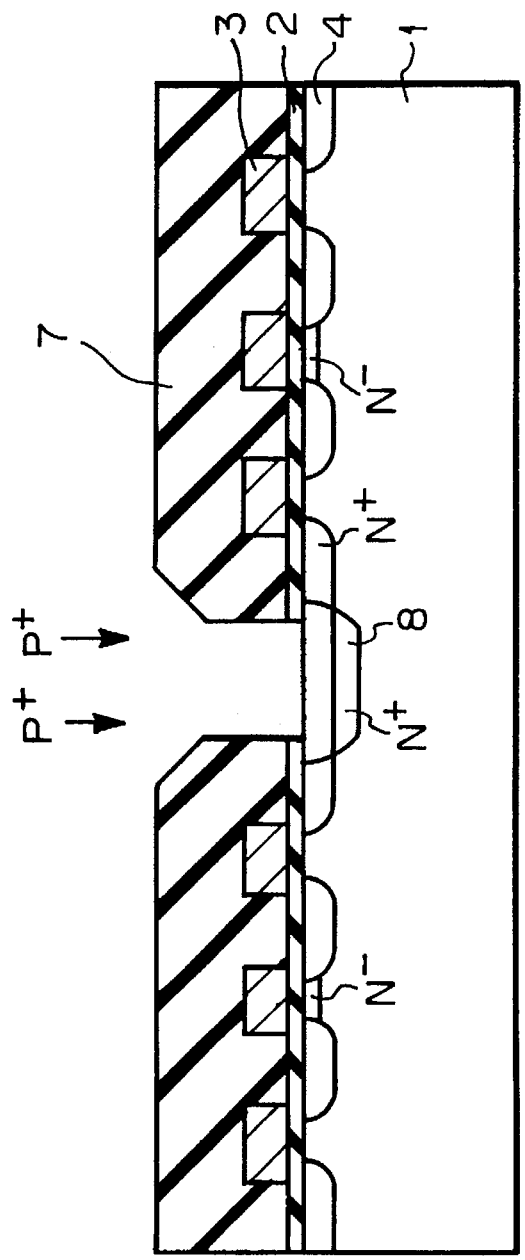
Fig. 2C PRIOR ART
Fig. 2D PRIOR ART

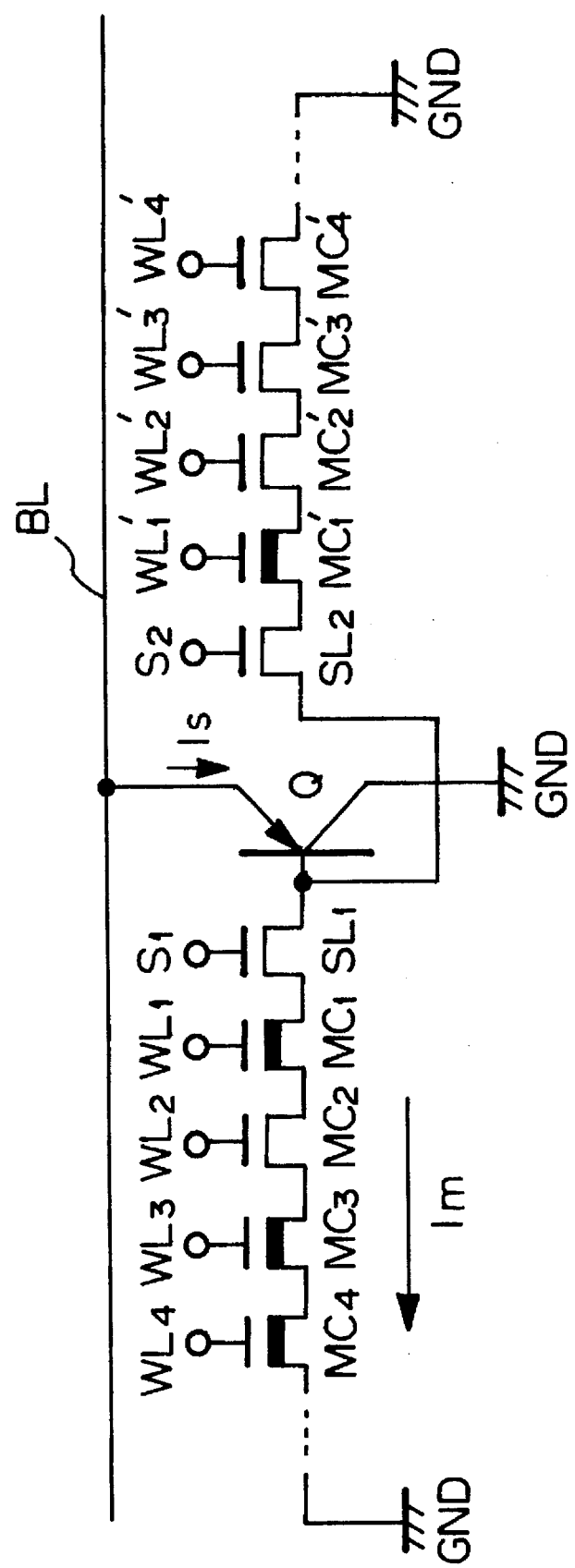

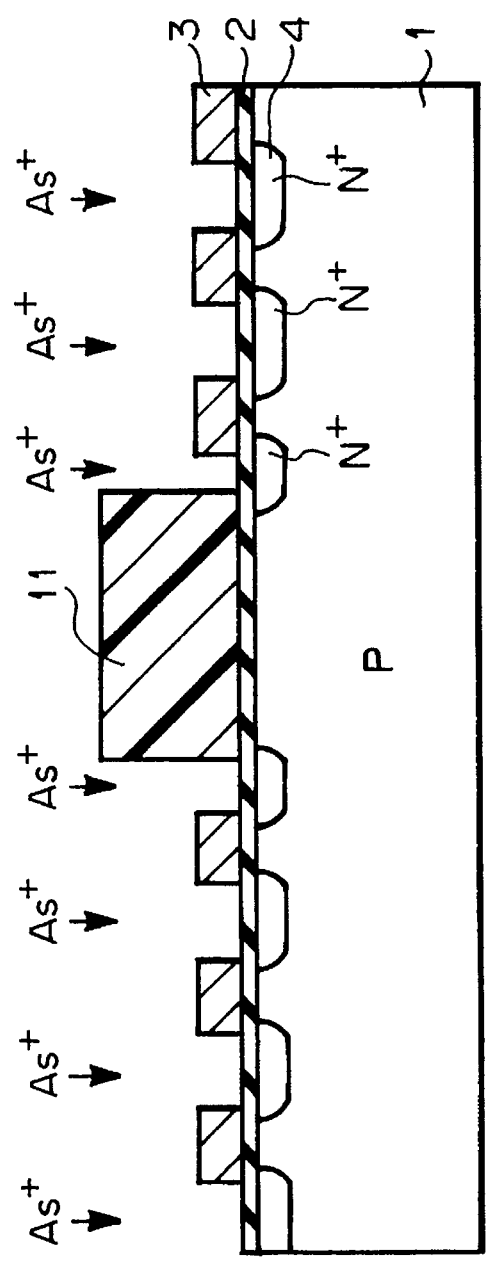
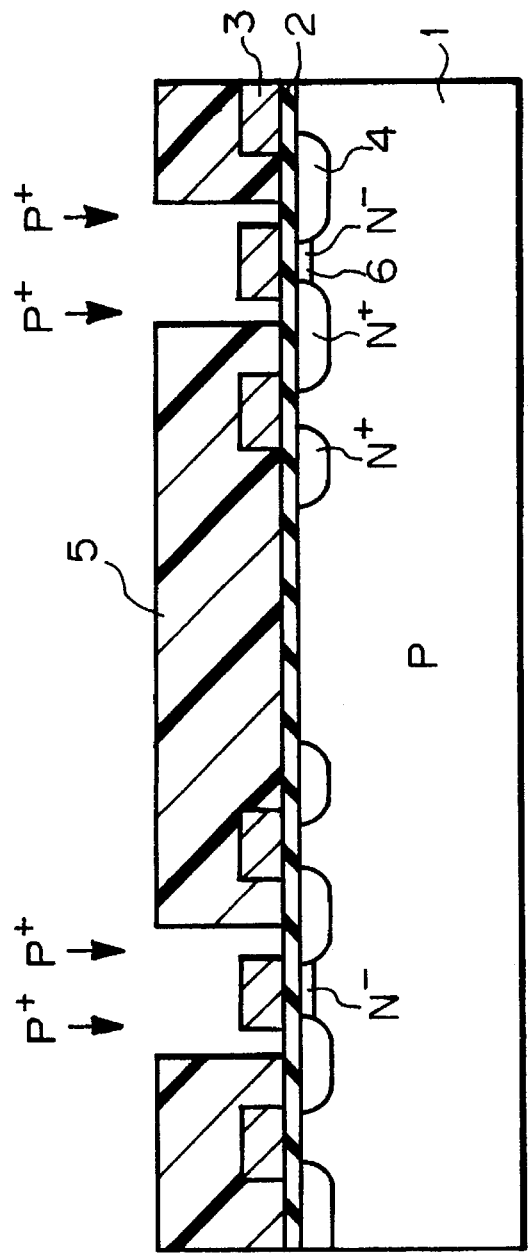
Fig. 4A
Fig. 4B

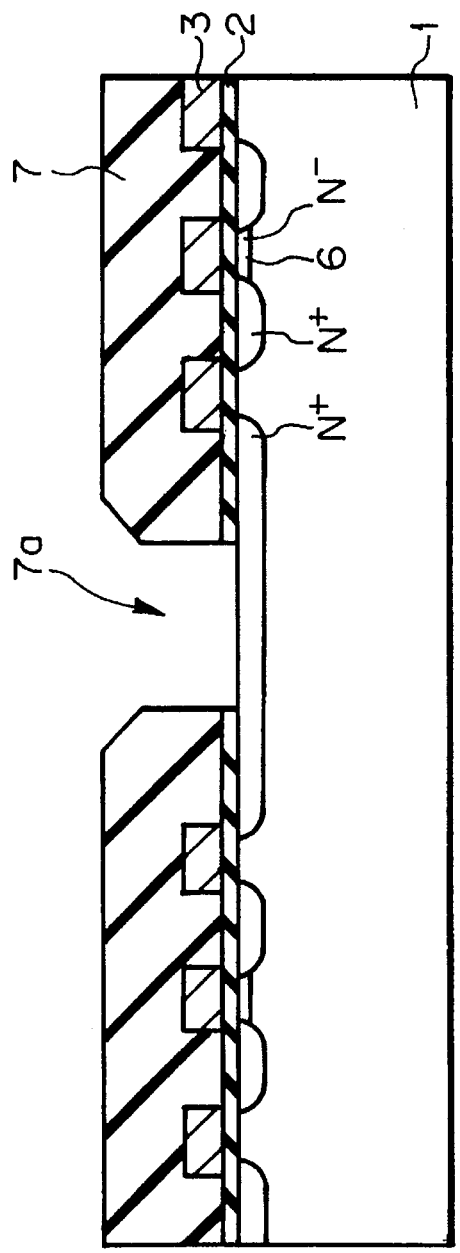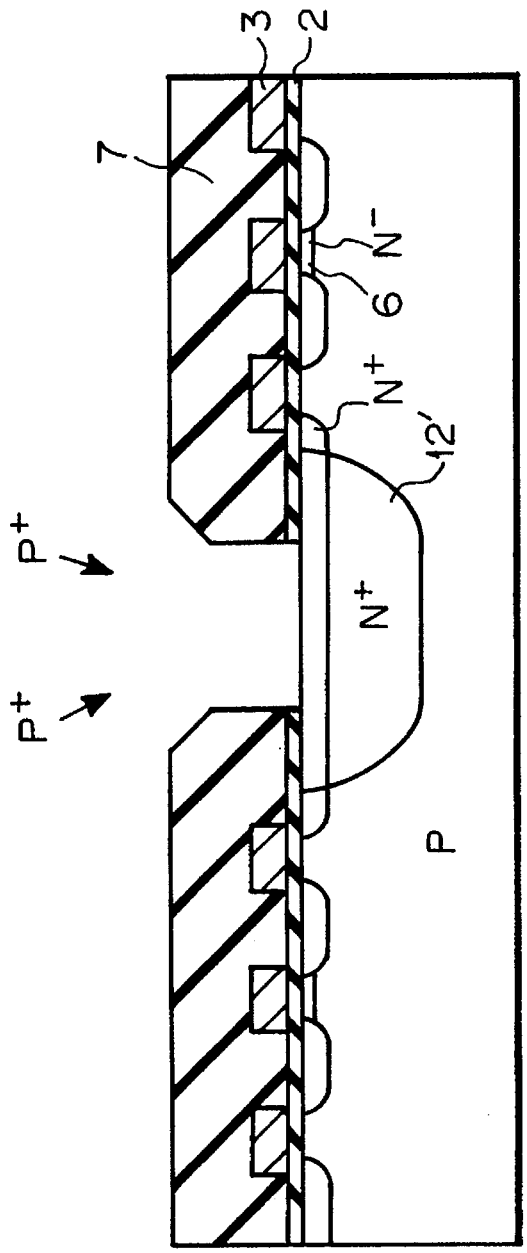

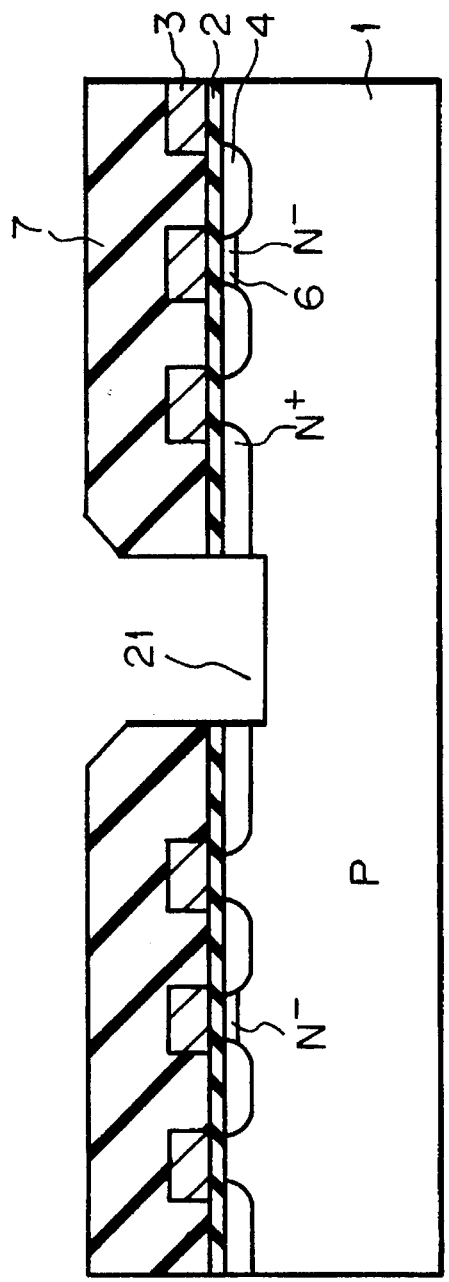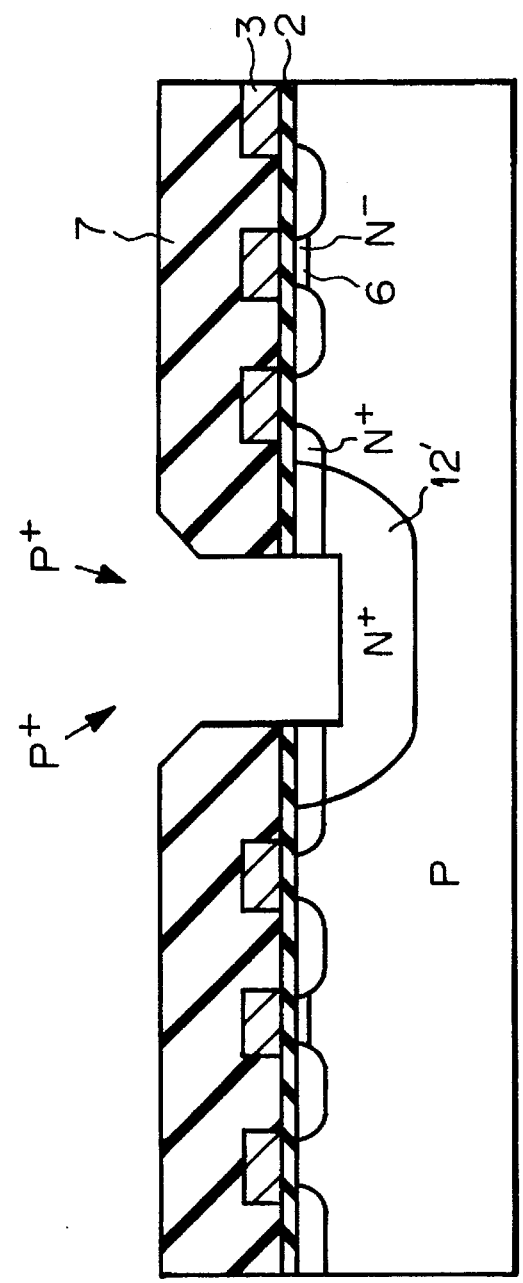
Fig. 7A
Fig. 7B

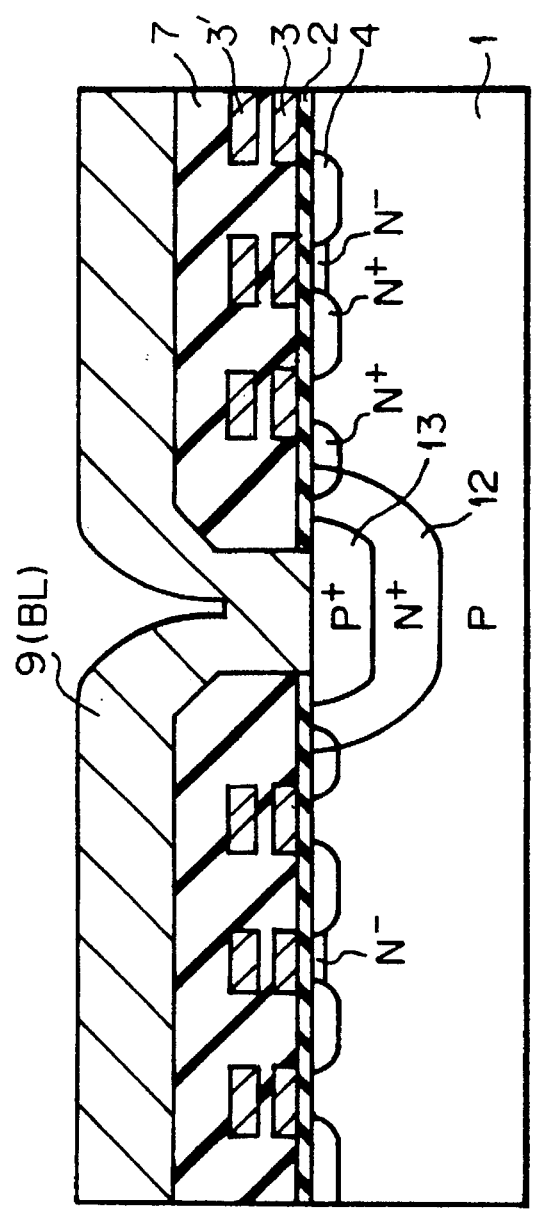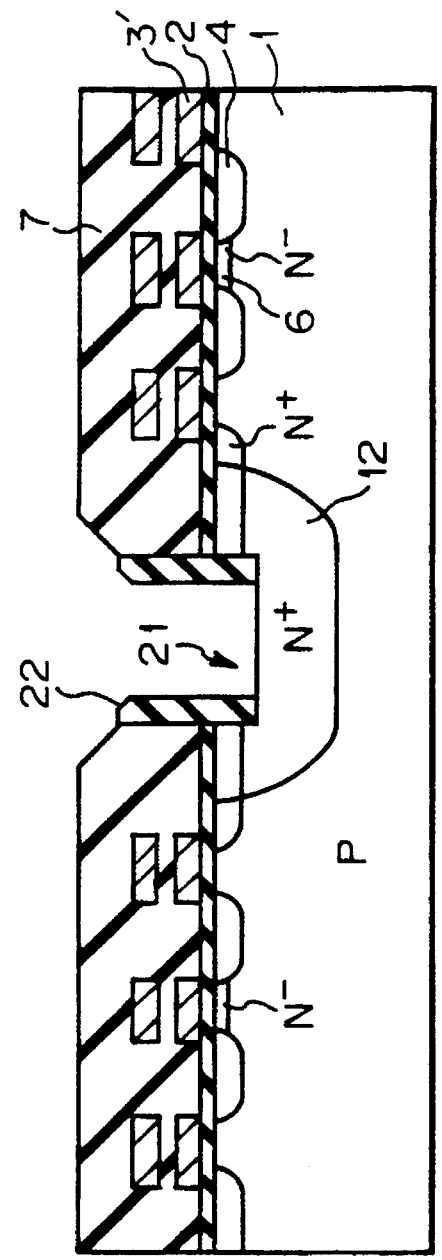
Fig. 11A
Fig. 11B

METHOD FOR MANUFACTURING NAND TYPE SEMICONDUCTOR MEMORY DEVICE

BACKGROUND OF THE INVENTION

1. Field of the Invention

The present invention relates to a method for manufacturing a semiconductor device, and more particularly, to a method for manufacturing a NAND type semiconductor memory device.

2. Description of the Related Art

NAND type memory devices such as read-only memories (ROM's) and flash memories have been broadly used, since NAND type memory devices have higher integration than NOR type memory devices.

In a prior art NAND type ROM device, at least one series of memory cells are connected to a bit line, and therefore, a memory cell current flowing through the memory cells, i.e., a current flowing through the bit line is sensed. However, when the integration is advanced, such a memory cell current is remarkably reduced, for example, to about 10 to 20 μA. As a result a high precision sense circuit is required to sense such a small memory cell current; however, this type of high precision sense circuit is subjected to noise, thus inviting erroneous operation. This will be explained later in detail.

On the other hand, in order to enhance a sense current flowing in an N-channel MOS transistor, a BiMOS device is known where a base of a PNP-type bipolar transistor is connected to the drain of a MOS transistor (see: N. Rovedo et al., "PROCESS DESIGN FOR MERGED COMPLEMETARY BICMOS", IEDM Technical Digest, 1990, pp. 485–488). Therefore, if this CMOS configuration is applied to a NAND type ROM, a sense current flowing through the bit line is substantially increased.

When manufacturing the above-mentioned NAND type ROM device where a bipolar transistor is connected between the bit line and the memory cells, after a shallow base region of the bipolar transistor is formed, an emitter electrode is formed on the base region. Then, a deep drain region of the MOS transistor is formed and is connected to the base region of the bipolar transistor (see: FIG. 3 of the above-mentioned document). As a result, if the drain of the MOS transistor is deviated from the base region of the bipolar transistor, the operation becomes unstable.

SUMMARY OF THE INVENTION

It is an object of the present invention to provide a stable method for manufacturing a NAND type semiconductor memory device incorporating a bipolar transistor for enhancing a sense current.

Another object is to provide a stable method for manufacturing a BiMOS device.

According to the present invention, a plurality of gate electrodes are formed over a semiconductor substrate of a first conductivity type, and impurities of a second conductivity type are introduced into the substrate with a mask of the gate electrodes, to form source/drain impurity regions. Then, an insulating pattern is formed on the gate electrode and the source/drain impurity regions, and impurities of the second conductivity type are introduced into the substrate with a mask of the insulating pattern, to form a deep base region which is connected to one of the source/drain impurity regions. Also, impurities of the first conductivity type are introduced into the substrate with a mask of the insulating pattern, to form a shallow emitter region. Since the base region is deeply formed, the base region is stably connected to one of the source/drain regions.

BRIEF DESCRIPTION OF THE DRAWINGS

The present invention will be more clearly understood from the description as set forth below, as compared with the prior art, with reference to the accompanying drawings, wherein:

FIGS. 2A through 2E are cross-sectional views explaining a prior art method for manufacturing the NAND type ROM device of FIG. 1;

FIG. 3 is a circuit diagram illustrating a NAND type ROM device to which embodiments of the manufacturing method according to the present invention are applied;

FIGS. 4A through 4F are cross-sectional views illustrating a first embodiment of the method for manufacturing a NAND type ROM device according to the present invention;

FIGS. 6A through 6H are cross-sectional views illustrating a second embodiment of the method for manufacturing a NAND type ROM according to the present invention;

FIGS. 7A through 7B are cross-sectional views of modifications of the devices of FIGS. 6D and 6E, respectively;

FIGS. 11A and 11B are cross-sectional views of modifications of FIGS. 9A and 9B, respectively.

DESCRIPTION OF THE PREFERRED EMBODIMENTS

Before the description of the preferred embodiments, a prior art method for manufacturing a NAND type ROM device will be explained with reference to FIGS. 1 and 2A through 2E.

Figure 1:
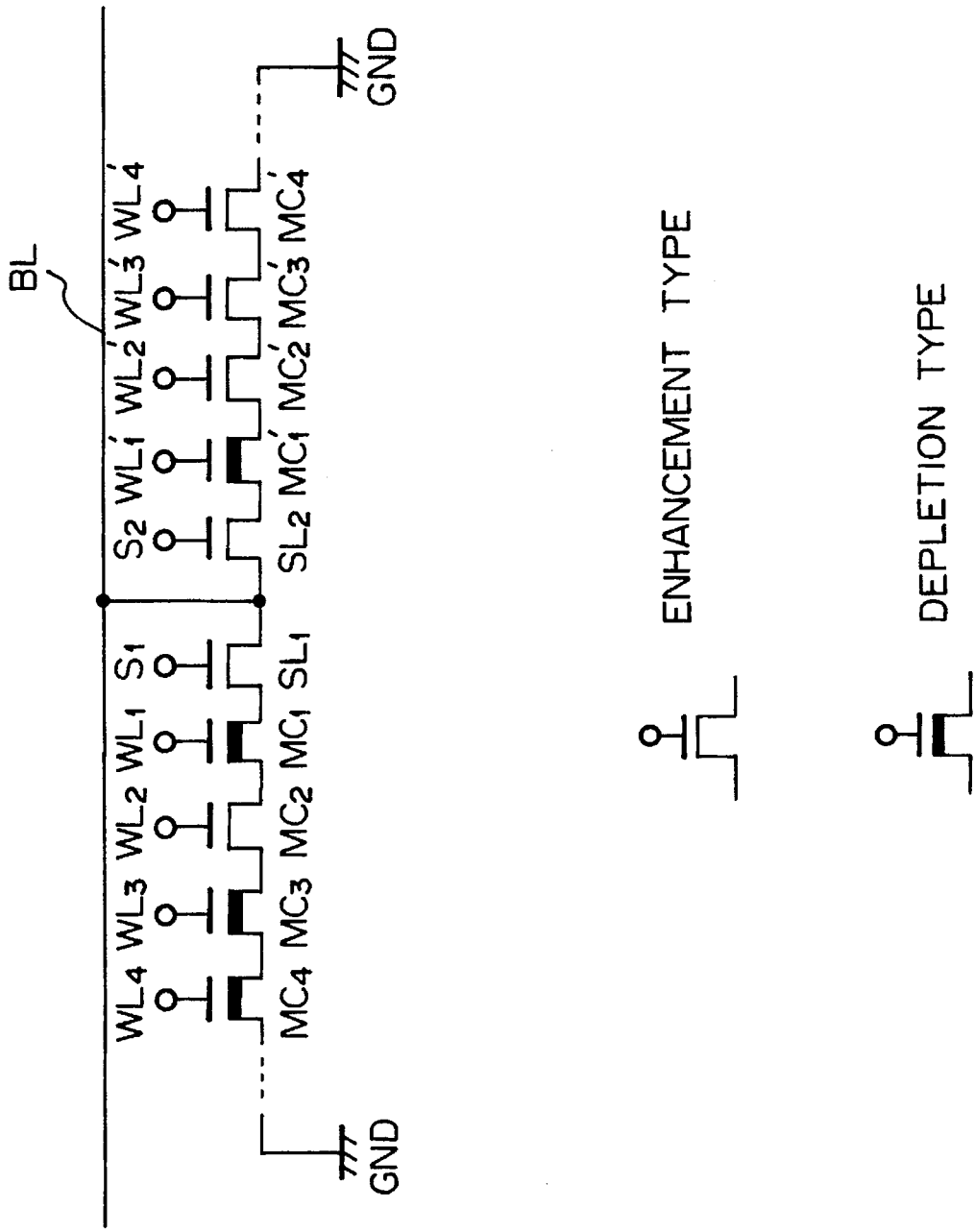
FIG. 1 is a circuit diagram illustrating a prior art NAND type ROM device.

In FIG. 1, which illustrates a prior art NAND type ROM device, a series of memory cells $MC_1$, $MC_2$, . . . are connected between a bit line BL such as a power supply terminal and a ground terminal GND, and a series of memory cells $MC_1'$, $MC_2'$, . . . are connected between the bit line BL and the ground terminal GND. Also, a selection transistor $SL_1$ is interposed between the bit line BL and the series of the memory cells $MC_1$, $MC_2$, . . . , and a selection transistor $SL_2$ is interposed between the bit line BL and the series of the memory cells $MC_1'$, $MC_2'$, . . . Each of the memory cells $MC_1$, $MC_2$, . . . $MC_1'$, $MC_2'$, . . . is of an enhancement type or a depletion type in accordance with whether or not impurities are introduced into the channel region thereof. On the other hand, the selection transistors $SL_1$ and $SL_2$ are of an enhancement type.

The gate electrodes of the memory cells $MC_1$, $MC_2$, ... $MC_1'$, $MC_2'$, ... are connected to word lines $WL_1$, $WL_2$, ... $WL_1'$, $WL_2'$, ... respectively, while the gate electrodes of the selection transistors $SL_1$ and $SL_2$ are connected to selection signal line $S_1$ and $S_2$, respectively. When the voltage of the selection signal line $S_1$ is high, the series of the memory cells $MC_1$, $MC_2$, ... are selected and are connected to the bit line BL. On the other hand, when the voltage of the selection signal line $S_2$ is high, the series of the memory cells $MC_1'$, $MC_2'$, ... are selected and are connected to the bit line BL.

The number of the series of memory cells connected to the bit line BL can be changed as occasion demands. Particularly, if the number of the series of memory cells connected to the bit line BL is 1, the selection transistors are unnecessary, as the series of memory cells are connected directly to the bit line BL.

A method for manufacturing the NAND type ROM device of FIG. 1 is explained next with reference to FIGS. 2A through 2E.

First, referring to FIG. 2A, a P type monocrystalline silicon substrate 1 is thermally oxidized to form a thin gate silicon oxide layer 2. Then, gate electrodes 3 made of polycrystalline silicon including phosphorus are formed by using a chemical vapor deposition (CVD) process and a photolithography process. Next, arsenic ions are doped into the silicon substrate 1 with a mask of the gate electrodes 3, to form $N^+$ type impurity regions 4 within the silicon substrate 1.

Next, referring to FIG. 2B, a photoresist pattern 5 is formed by using a photolithography process, and phosphorous ions are doped into the silicon substrate 1 with a mask of the photoresist pattern 5, thus completing a data write operation, to convert required memory cells of an enhancement the into those of a depletion type. In this case, the energy of the phosphorous ions is so large as to penetrate the gate electrodes 3 and the gate silicon oxide layer 2 to reach the silicon substrate 1, thus creating $N^-$ type impurity regions 6 within the silicon substrate 1 beneath the gate silicon oxide layer 2. Then, the photoresist layer 5 is removed.

Next, referring to FIG. 2C, a silicon oxide layer 7 is formed on the entire surface by using a CVD process. Then, an opening 7a is perforated in the silicon oxide layer 7.

Next, referring to FIG. 2D, about $1\times10^{14}$ to $1\times10^{15}$ phosphorous ions/cm$^2$ are doped at an energy of about 50 to 100 keV into the silicon substrate 1 with a mask of the silicon oxide layer 7, thus creating a contact $N^+$ type impurity region 8 within the silicon substrate 1.

Figure 2E:
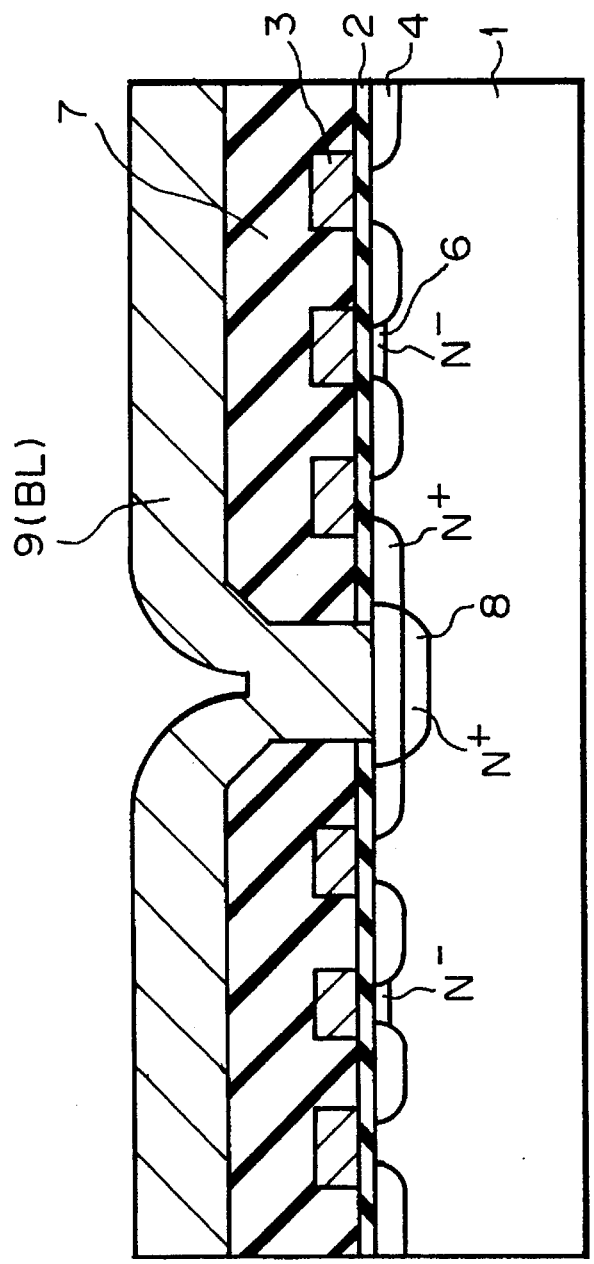

Finally, referring to FIG. 2E, an aluminum layer 9 is formed by using a sputtering process and a photo lithography process. The aluminum layer 9 is connected to the $N^+$ type impurity region 4 via the contact $N^+$ type impurity region 8 which is deeper than the $N^+$ type impurity region 4, thus preventing an alloy spike phenomenon caused by the fact that the aluminum layer 9 is connected directly to the P type portion of the silicon substrate 1. The aluminum layer 9 serves as the bit line BL of FIG. 1.

Thus, the NAND type ROM device of FIG. 1 is completed.

In the NAND type ROM device illustrated in FIGS. 1 and 2A through 2E, however, as the integration is advanced, a memory cell current from the bit line BL via one of the selection transistors $SL_1$ and $SL_2$ and one of the series of the memory cells $MC_1$, $MC_2$, ... and the series of the memory cells $MC_1'$, $MC_2'$ the ground terminal GND is remarkably reduced to, for example, about 10 to 20 µA. In order to sense such a small memory cell current, a high precision sensing circuit, which is susceptible to noise, is required.

Note that, if the channel width of the memory cells is made large, a memory cell current can be large; however, this reduces the integration. Also, if the gate length of the memory cells is made small, a memory cell current can be large; however, this requires a finer processing technology and reduces the reliability due to the short channel.

In FIG. 3, which is a circuit diagram illustrating a NAND type ROM device to which embodiments of the present invention are applied, a bipolar transistor Q is interposed between the bit line BL and the selection transistor $SL_1$ ($SL_2$). That is, an emitter of the bipolar transistor Q is connected to the bit line BL, and a base of the bipolar transistor Q is connected via the selection transistors $SL_1$ and $SL_2$ to the series of the memory cells $MC_1$, $MC_2$, ... and the series of the memory cells $MC_1'$, $MC_2'$, ... Also, a collector of the bipolar transistor Q is connected to the ground terminal GND. Therefore, when the selection transistor $S_1$ is turned ON so that a memory cell current $I_m$ flows through the memory cells $MC_1$, $MC_2$, ..., a sense current $I_s$ flowing through the bit line BL is represented by $$I_s = \beta I_m$$

where β is a current amplification of the transistor Q. For example, if β is 10, the sense current $I_s$ is about 100 to 200 µA, even if the memory cell current $I_m$ is about 10 to 20 µA.

FIGS. 4A through 4F are cross-sectional views illustrating a first embodiment of the method for manufacturing a NAND type ROM device as shown in FIG. 3 according to the present invention.

First, referring to FIG. 4A, a P type monocrystalline silicon substrate 1 having a concentration of about $5\times10^{16}$ to $5\times10^{17}$ cm$^{-3}$ is thermally oxidized at a temperature of about 750° C. to 900° C. to form an about 15 to 20 nm thick gate silicon oxide layer 2. Then, about 300 to 400 nm thick gate electrodes 3 made of polycrystalline silicon including phosphorus are formed by using a CVD process and a photolithography process. Next, a photoresist pattern 11 is formed on the gate silicon oxide layer 2 to cover a region where the bipolar transistor Q of FIG. 3 is to be formed. Then, arsenic ions are doped into the silicon substrate 1 with a mask of the gate electrodes 3 and the photoresist pattern 11, to form an $N^+$ type impurity region 4 within the silicon substrate 1. The concentration of the $N^+$ type impurity region 4 is about $1\times10^{20}$ cm$^{-3}$ $1\times10^{21}$ cm$^{-3}$.

Next, referring to FIG. 4B, in the same way as in FIG. 2B, a photoresist pattern 5 is formed by using a photolithography process, and phosphorous ions are doped into the silicon substrate 1 with a mask of the photoresist pattern 5, thus completing a data write operation, to convert required memory cells of an enhancement type into those of a depletion type. In this case, the energy of the phosphorous ions is so large as to penetrate the gate electrodes 3 and the gate silicon oxide layer 2 to reach the silicon substrate 1, thus creating $N^-$ type impurity regions 6 within the silicon substrate 1 beneath the gate silicon oxide layer 2. For example, the energy of the phosphorous ions is about 300 to 400 keV, and the number of the phosphorous ions is about $1\times10^{13}$ cm$^{-2}$ to $5\times10^{14}$ cm$^{-2}$. Then, the photoresist layer 5 is removed.

Figure 4C:
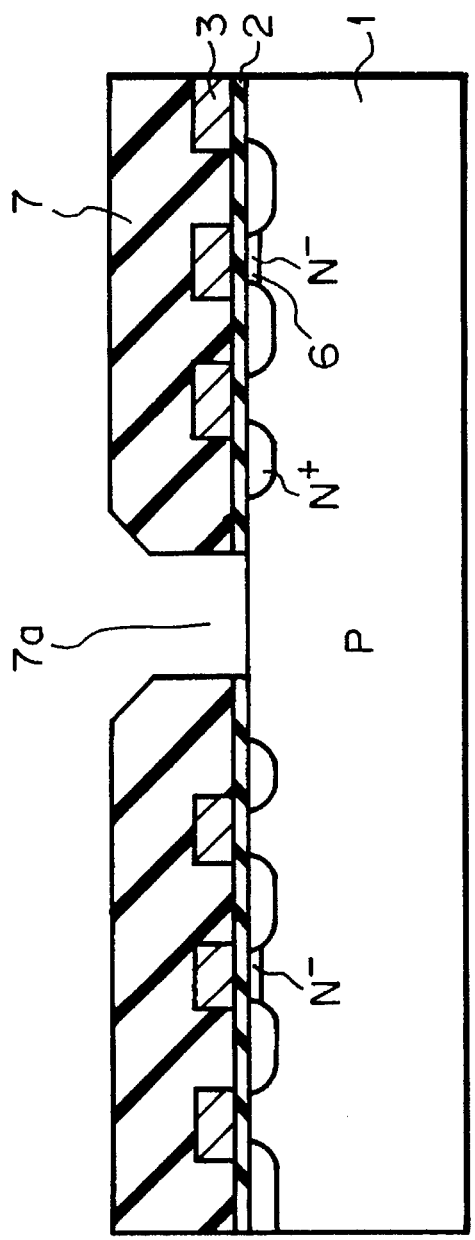

Next, referring to FIG. 4C, in the same way as in FIG. 2C, a silicon oxide layer 7 is formed on the entire surface by using a CVD process. Then, an opening 7a is perforated in the silicon oxide layer 7.

Figure 4D:
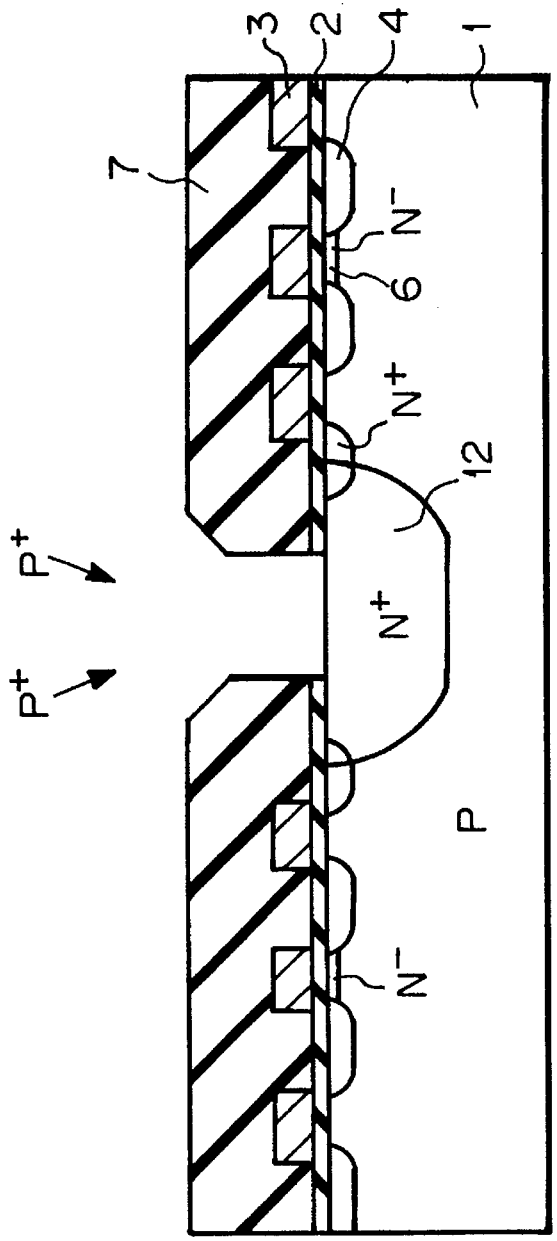

Next, referring to FIG. 4D, about $1\times10^{13}$ to $1\times10^{14}$ phosphorous ions/cm$^2$ are doped obliquely at an energy of about 200 to 400 keV into the silicon substrate 1 with a mask of the silicon oxide layer 7, thus creating an N$^+$ type impurity region 12 within the silicon substrate 1. This N$^+$ type impurity region 12 serves as a base region of the bipolar transistor Q of FIG. 3.

Figure 4E:
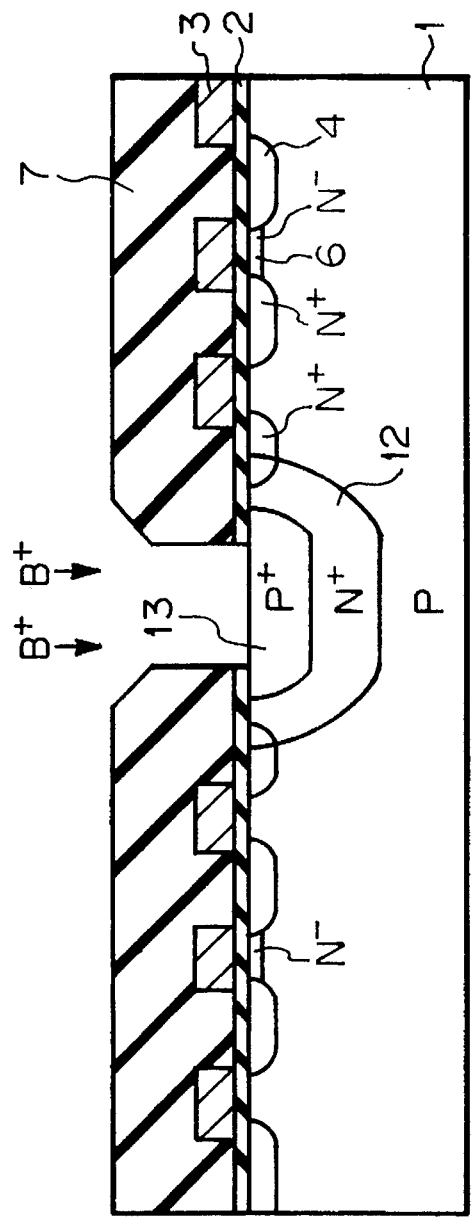

Next, referring to FIG. 4E, about $1\times10^{15}$ to $5\times10^{15}$ boron ions/cm$^2$ are doped at an energy of about 30 to 50 keV into the silicon substrate 1 with a mask of the silicon oxide layer 7, thus creating an about 200 to 300 nm thick contact P$^+$ type impurity region 13 within the silicon substrate 1. After that, an annealing operation at about 900° C. is carried out. This N$^+$ type impurity region 13 serves as an emitter region of the bipolar transistor Q of FIG. 3.

Figure 4F:
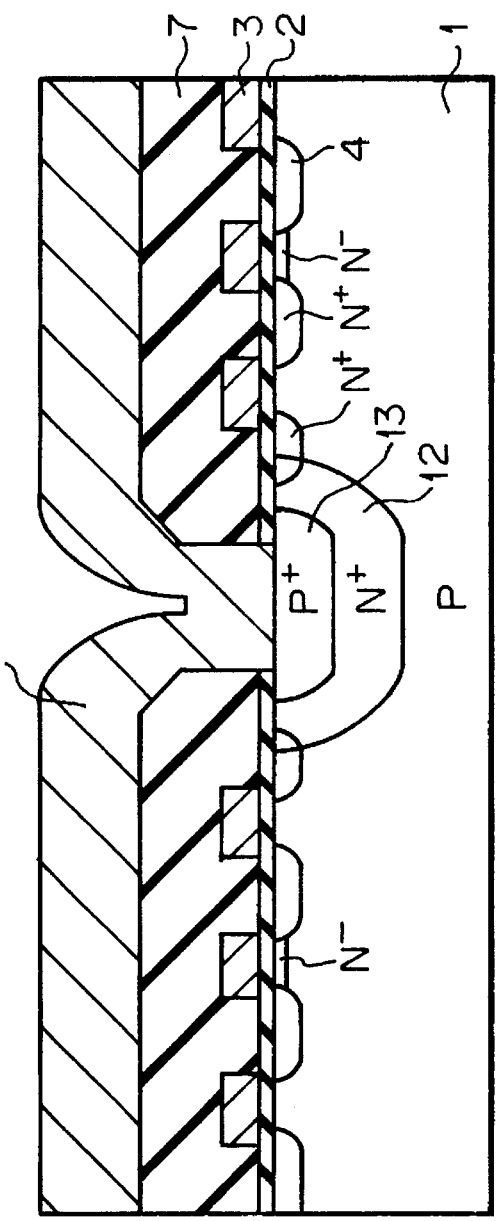

Finally, referring to FIG. 4F in the same way as in FIG. 2E, an aluminum layer 9 is formed by using a sputtering process and a photolithography process. The aluminum layer 9 is connected to the contact P$^+$ type impurity region 13.

Thus, the NAND type ROM device of FIG. 3 is completed.

Figure 5A:
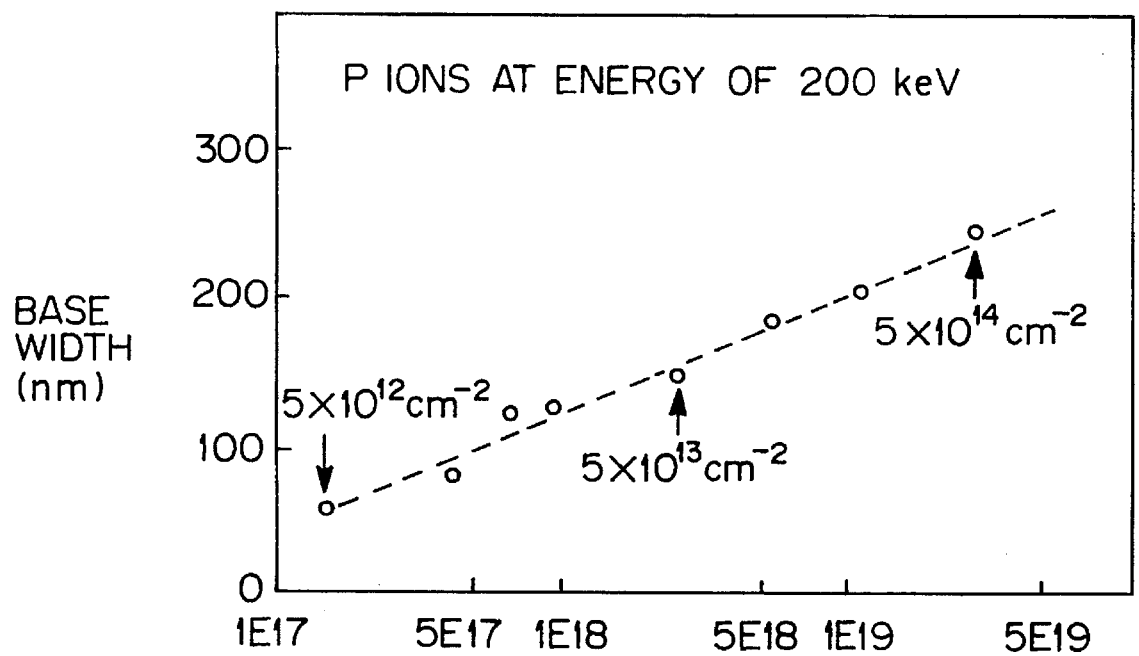
FIG. 5A is a diagram showing base width characteristics of the ROM device obtained by the method as illustrated FIGS. 4A through 4F.
Figure 5B:
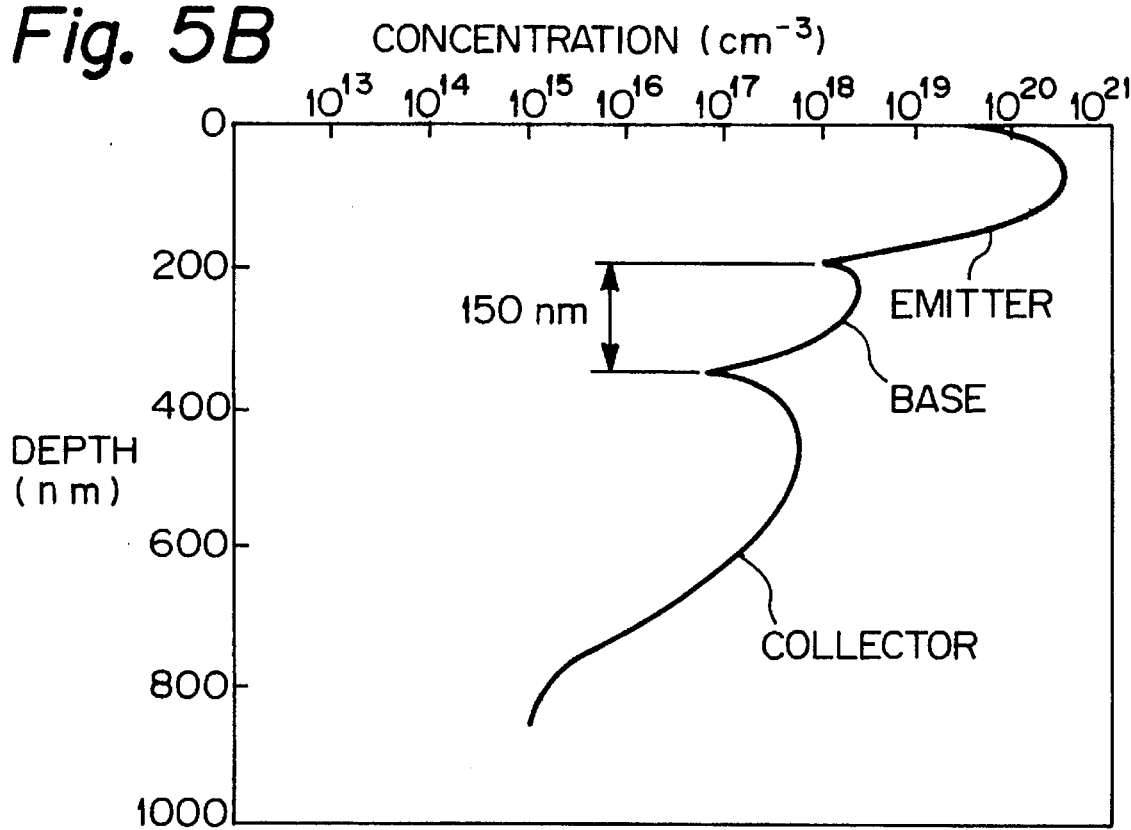
FIG. 5B is a diagram showing impurity concentration characteristics of the ROM device obtained by the method as illustrated in FIGS. 4A through 4F.

By the way, the concentration of the base N$^+$ type impurity region 12 is an important parameter for determining the current amplification β of the bipolar transistor Q of FIG. 3. For example, if the energy of phosphorous ions as shown in FIG. 4D is 200 keV and the depth of the emitter P$^{+\circ}$type impurity region 13 is about 200 nm, the base width characteristics with respect to the number of phosphorous ions from $5\times10^{12}$ cm$^{-2}$ to $5\times10^{14}$ cm$^{-2}$ are as shown in FIG. 5A. That is, when the number of doped phosphorous ions is $5\times10^{13}$ cm$^{-2}$, the base width is 150 nm. Also, if the emitter depth and the base width are 200 nm and 150 nm, respectively, and the number of doped phosphorous ions is $5\times10^{13}$ cm$^{-2}$, the profile of concentration of impurities of the bipolar transistor Q is shown in FIG. 5B, which can obtain a current amplification of more than 10.

Note that, in order to obtain a current amplification of more than 10, it is important that the contact P$^+$ type impurity region 13 never reaches the N$^+$ type impurity region 4. In the first embodiment as shown in FIGS. 4A through 4F, however, the base N$^+$ type impurity region 12 and the emitter P$^+$ type impurity region 13 are not formed in self-alignment with the N$^+$ type impurity region 4. Therefore, the characteristics of the bipolar transistor Q fluctuate, so that the current amplification of the bipolar transistor Q may be reduced.

FIGS. 6A through 6H are cross-sectional views illustrating a second embodiment of the method for manufacturing a NAND type ROM device as shown in FIG. 3 according to the present invention.

Figure 6A:
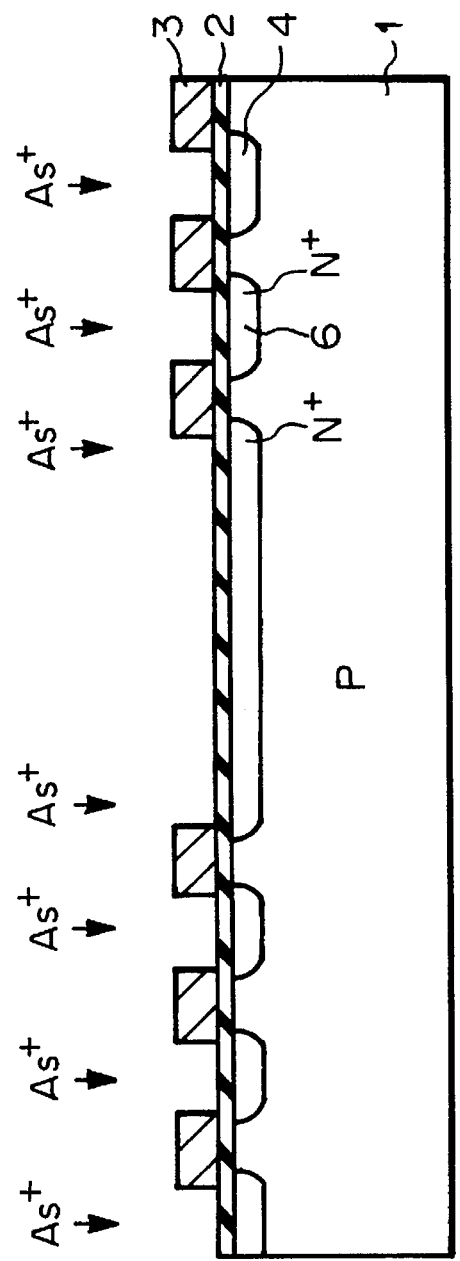

First, referring to FIG. 6A, in a similar way to that in FIG. 2A, a P type monocrystalline silicon substrate 1 having a concentration of about $5\times10^{16}$ to $5\times10^{17}$ cm$^{-3}$ is thermally oxidized at a temperature of about 750° C. to 900° C. to form an 15 to 20 nm thick gate silicon oxide layer 2. Then, about 300 to 400 nm thick gate electrodes 3 made of polycrystalline silicon including phosphorus are formed by using a CVD process and a photolithography process. Next, arsenic ions are doped into the silicon substrate 1 with a mask of the gate electrodes 3, to form N$^+$ type impurity regions 4 within the silicon substrate 1. The concentration of the N$^+$ type impurity regions 4 is about $1\times10^{20}$ cm$^{-3}$ $1\times10^{21}$ cm$^{-3}$.

Figure 6B:
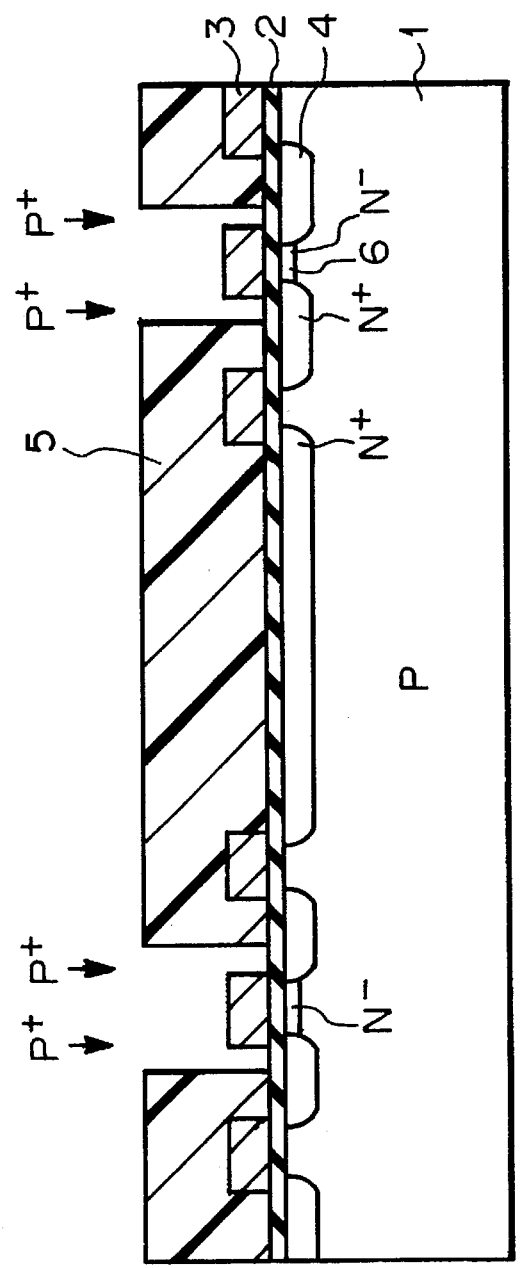

Next, referring to FIG. 6B, in the same way as in FIG. 2B, a photoresist pattern 5 is formed by using a photolithography process, and phosphorous ions are doped into the silicon substrate 1 with a mask of the photoresist pattern 5, thus completing a data write operation, to convert required memory cells of an enhancement type into those of a depletion type. Also, in this case, the energy of the phosphorous ions is so large as to penetrate the gate electrodes 3 and the gate silicon oxide layer 2 to reach the silicon substrate 1, thus creating N$^-$ type impurity regions 6 within the silicon substrate 1 beneath the gate silicon oxide layer 2. Then, the photoresist layer 5 is removed.

Next, referring to FIG. 6C, in the same way as in FIG. 2C, a silicon oxide layer 7 is formed on the entire surface by using a CVD process. Then, an opening 7a is perforated in the silicon oxide layer 7.

Next, referring to FIG. 6D, in a similar way to that in FIG. 4D, phosphorous ions are doped obliquely into the silicon substrate 1 with a mask of the silicon oxide layer 7, thus creating an N$^+$ type impurity region 12' within the silicon substrate 1. This N$^+$ type impurity region 12' serves as a base region of the bipolar transistor Q of FIG. 3. The N$^+$ type impurity region 12' is deeper than the N$^+$ type impurity region 12 of the first embodiment; for example, the N$^+$ type impurity region 12' is about 500 to 600 nm in depth. However, the concentration of the N$^+$ type impurity region 12' is the same as that of the N$^+$ type impurity region 12 of the first embodiment.

Figure 6E:
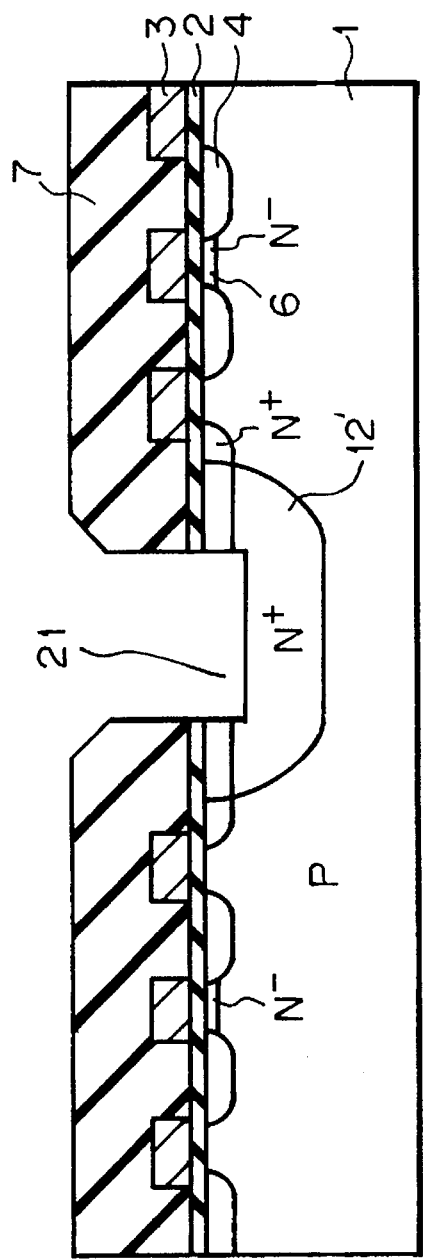

Next, referring to FIG. 6E, the silicon substrate 1 is etched by an anisotropic plasma etching process using a mixture gas of CCl$_2$F$_2$ and N$_2$, to form a shallow trench 21 within the silicon substrate 1. Since the N$^+$ type impurity region 4 is about 100 to 150 nm in depth, the shallow trench 21 is about 200 to 250 nm in depth.

Figure 6F:
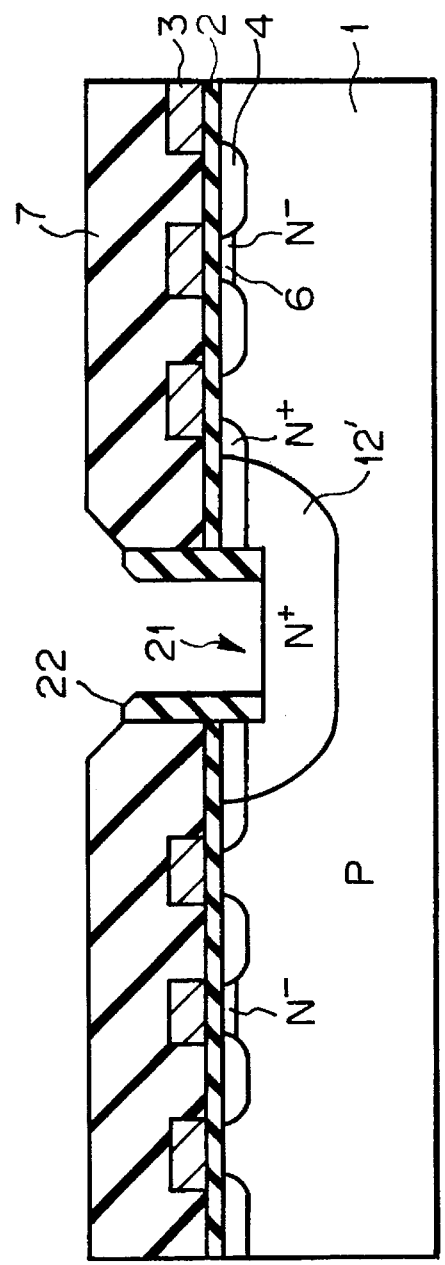

Next, referring to FIG. 6F, an about 100 to 200 nm thick silicon oxide layer is formed on the entire surface by using a CVD process, and the silicon oxide layer is etched back by an anisotropic plasma etching process using a mixture gas of CHF$_3$ and O$_2$. As a result, a sidewall silicon oxide layer 22 is left on a sidewall of the silicon oxide layer 7 and a sidewall of the shallow trench 21.

Figure 6G:
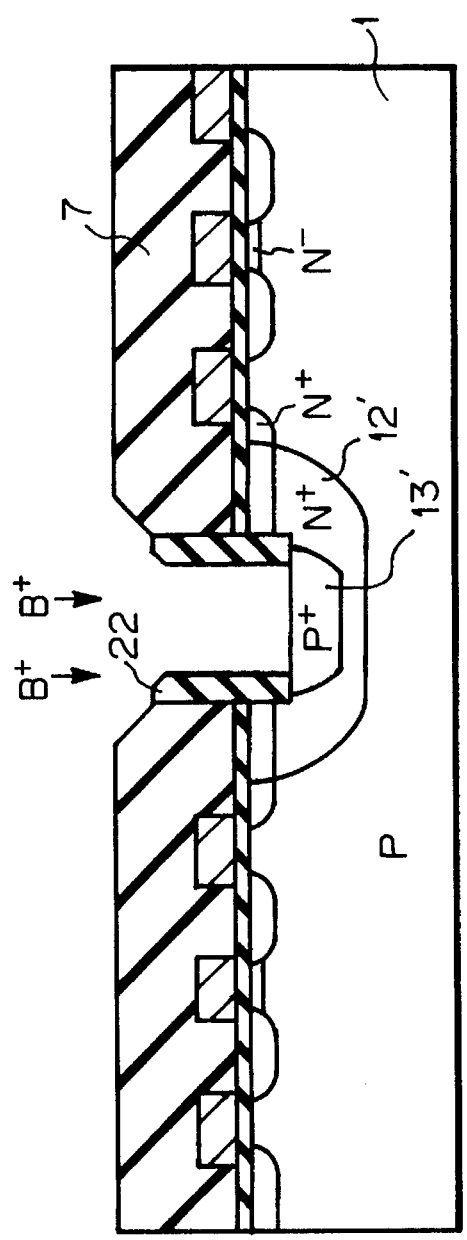

Next, referring to FIG. 6G, in a similar way to that in FIG. 4E, about $1\times10^{15}$ to $5\times10^{15}$ boron ions/cm$^2$ are doped at an energy of about 30 to 50 keV into the silicon substrate 1 with a mask of the silicon oxide layer 7 and the sidewall silicon oxide layer 22, thus creating an about 200 to 300 nm thick contact P$^+$ type impurity region 13' within the silicon substrate 1. After that, an annealing operation at about 900° C. is carried out. This N$^+$ type impurity region 13' serves as an emitter region of the bipolar transistor Q of FIG. 3.

Figure 6H:
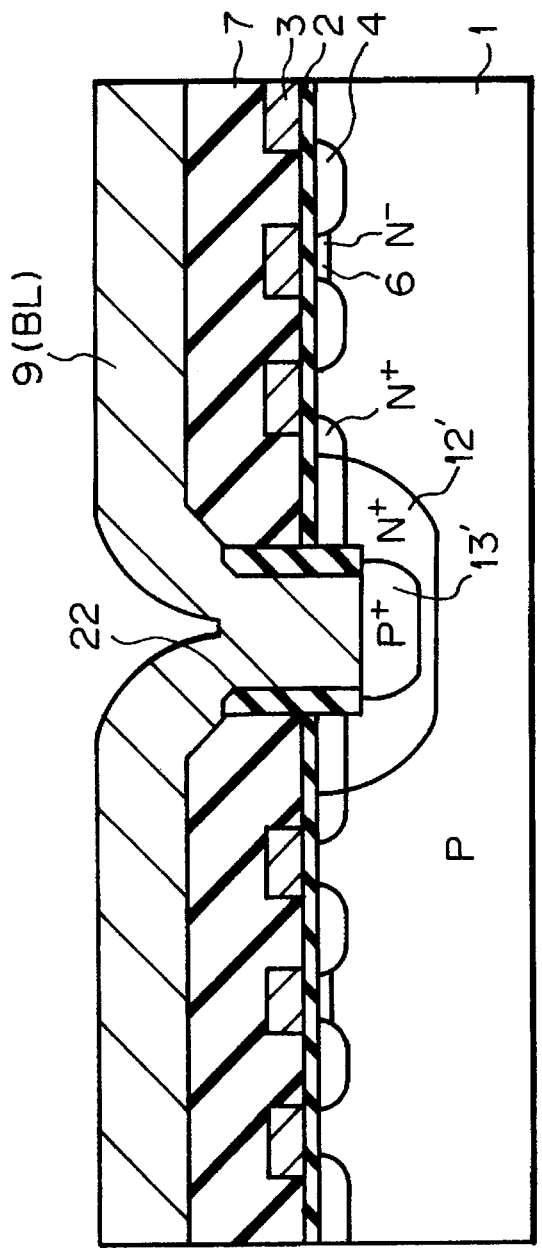

Finally, referring to FIG. 6H in the same way as in FIG. 4F, an aluminum layer 9 is formed by using a sputtering process and a photolithography process. The aluminum layer 9 is connected to the contact N$^+$ type impurity region 13'.

Thus, the NAND type ROM device of FIG. 3 is completed.

In the second embodiment, since the sidewall silicon oxide layer 22 is interposed between the emitter P$^+$ type impurity region 13' and the N$^+$ type impurity region 4, the emitter P$^+$ type impurity region 13' is never connected directly to the N$^+$ type impurity region 4. As a result, a large current amplification of the bipolar transistor Q can be obtained.

Note that, in the above-described second embodiment, after the base N$^+$ type impurity region 12' is formed, the shallow trench 21 is formed (see FIGS. 6D and 6E). However, as shown in FIGS. 7A and 7B, it is possible to form the base N$^+$ type impurity region 12' after the formation of the shallow trench 21.

Figure 8:
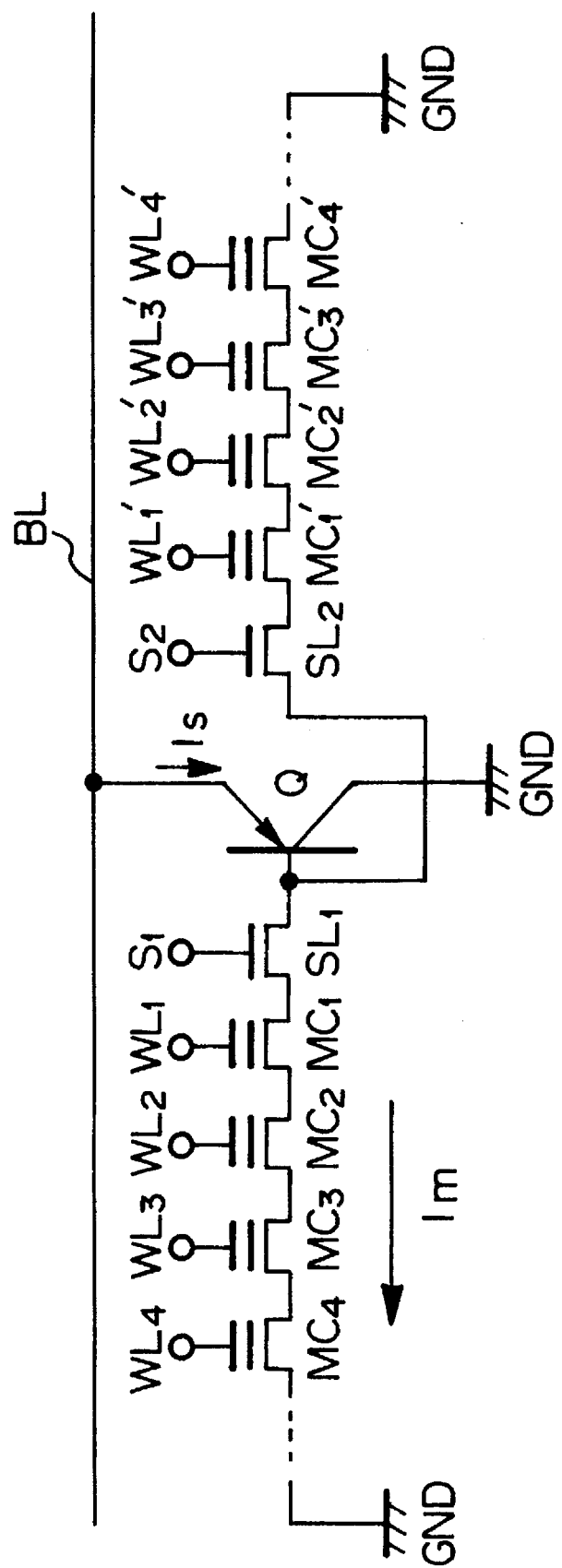
FIG. 8 is a circuit diagram illustrating a NAND type flash memory device to which the present invention is applied.
Figure 9A:
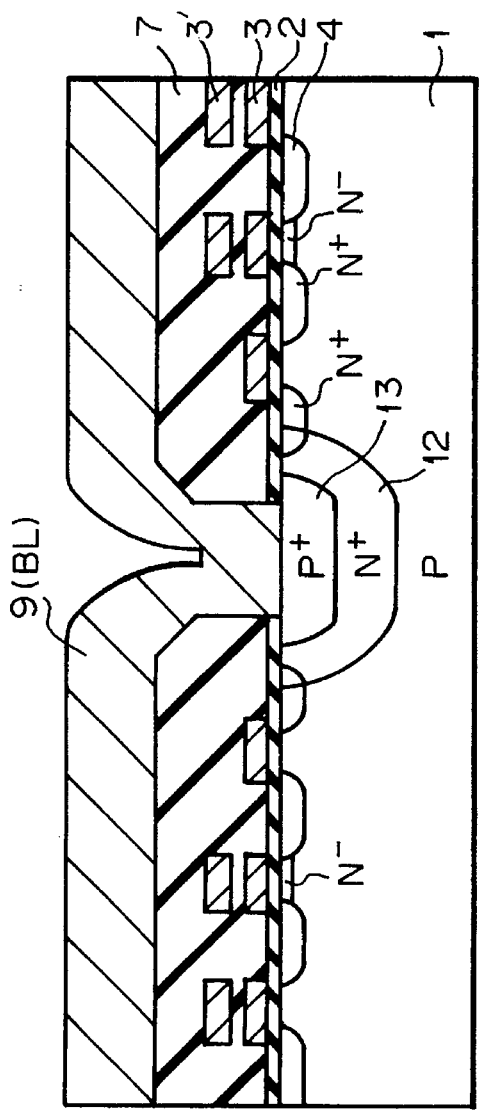
FIGS. 9A and 9B are cross-sectional views of modifications of the devices of FIGS. 4F and 6H, respectively.
Figure 9B:
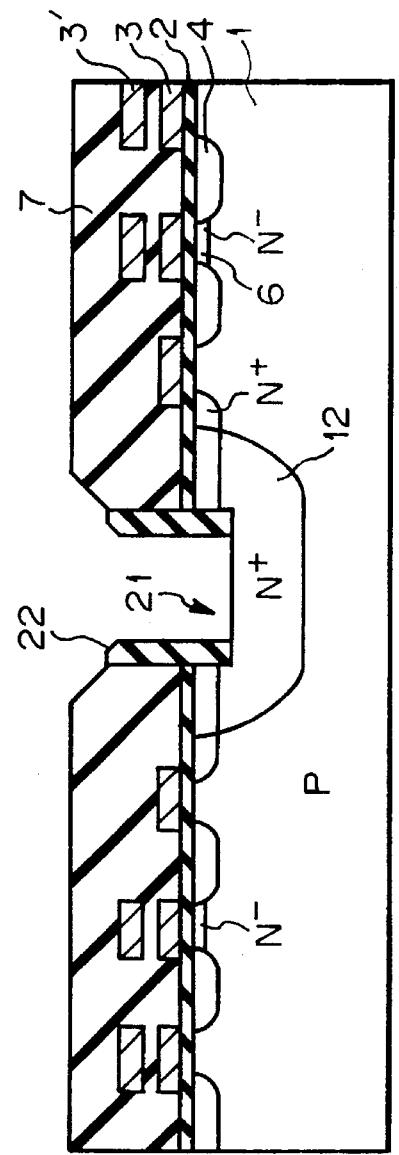

Also, the present invention can be applied to a NAND type flash memory device as illustrated in FIG. 8. In this case, the introduction of phosphorous ions in FIGS. 4B and 6B is unnecessary; instead of this, a step for forming a floating gate pattern is added to the first and second embodiments. Also, gate electrodes 3' serve as control gates. That is, the devices of FIGS. 4F and 6H are replaced by those of FIGS. 9A and 9B, respectively.

Figure 10:
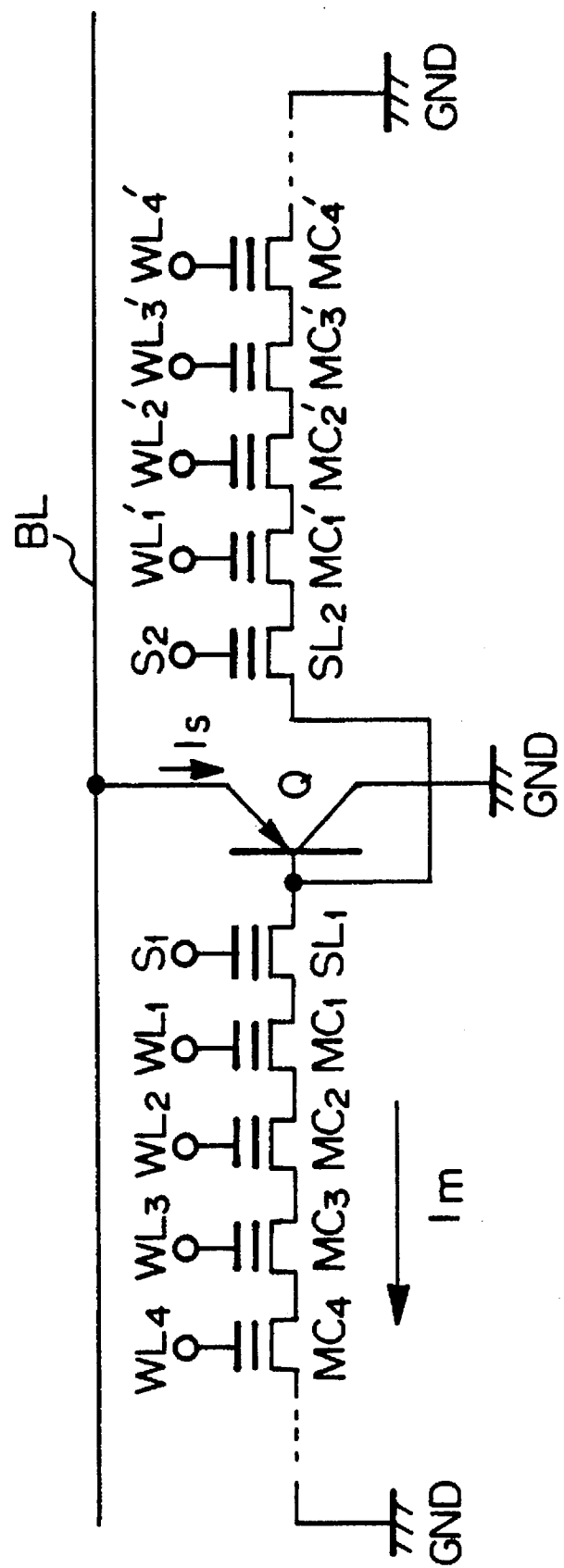
FIG. 10 is a circuit diagram of a modification of FIG. 8.

Further, the selection transistors $SL_1$ and $SL_2$ can also be of a floating gate type as illustrated in FIGS. 10, 11A and 11B.

As explained hereinbefore, according to the present invention, a stable NAND type semiconductor (memory) device incorporating a bipolar transistor can be obtained.

We claim:

1. A method for manufacturing a NAND type semiconductor memory device, comprising the steps of:

forming a plurality of gate electrodes over a semiconductor substrate of a first conductivity type;

forming a photoresist pattern on said semiconductor substrate adjacent to said plurality of gate electrodes;

introducing first impurities of a second conductivity type opposite to said first conductivity type with a mask of said gate electrodes and said photoresist pattern to form a plurality of first impurity regions within said semiconductor substrate;

forming an insulating pattern on said plurality of gate electrodes and said plurality of first impurity regions;

introducing second impurities of said second conductivity type into said semiconductor substrate with a mask of said insulating pattern to form a second impurity region within said semiconductor substrate, a junction depth of said second impurity region being larger than a junction depth of said first impurity regions;

introducing third impurities of said first conductivity type into said semiconductor substrate with a mask of said insulating pattern to form a third impurity region within said semiconductor substrate; and forming a conductive layer on said insulating pattern and said third impurity region.

2. A method as set forth in claim 1, wherein said gate electrode forming step forms a plurality of floating gate electrodes and a plurality of control gate electrodes over said floating gate electrodes.

3. A method for manufacturing a NAND type semiconductor memory device, comprising the steps of:

forming a plurality of gate electrodes over a semiconductor substrate of a first conductivity type;

introducing first impurities of a second conductivity type opposite to said first conductivity type with a mask of said gate electrodes to form a plurality of first impurity regions within said semiconductor substrate;

forming an insulating pattern on Said plurality of gate electrodes and said plurality of first impurity regions;

introducing second impurities of said second conductivity type into said semiconductor substrate with a mask of said insulating pattern to form a second impurity region within said semiconductor . substrate, a junction depth of said second impurity region being larger than a junction depth of said first impurity regions;

forming a trench in said second impurity region in self-alignment with said insulating pattern, a depth of said trench being larger than a depth of said first impurity regions and smaller than depth of said second impurity region;

forming a sidewall insulating layer on a sidewall of said second impurity region at said trench;

introducing third impurities of said first conductivity type into said semiconductor substrate with a mask of said insulating pattern and said sidewall insulating layer to form a third impurity region within said semiconductor substrate; and forming a conductive layer on said insulating pattern and said third impurity region.

4. A method as set forth in claim 3, wherein said gate electrode forming step forms a plurality of floating gate electrodes and a plurality of control gate electrodes over said floating gate electrodes.

5. A method for manufacturing a NAND type semiconductor memory device, comprising the steps of:

forming a plurality of gate electrodes over a semiconductor substrate of a first conductivity type;

introducing first impurities of a second conductivity type opposite to said first conductivity type with a mask of said gate electrodes to form a plurality of first impurity regions within said semiconductor substrate;

forming an insulating pattern on said plurality of gate electrodes and said plurality of first impurity regions;

forming a trench in said second impurity region in self-alignment with said insulating pattern, a depth of said trench being larger than a depth of said first impurity regions;

introducing second impurities of said second conductivity type into said semiconductor substrate with a mask of said insulating pattern to form a second impurity region within said semiconductor substrate, a junction depth of said second impurity region being larger than a depth of said trench;

forming a sidewall insulating layer on a sidewall of said second impurity region at said trench;

introducing third impurities of said first conductivity type into said semiconductor substrate with a mask of said insulating pattern and said sidewall insulating layer to form a third impurity region within said semiconductor substrate; and forming a conductive layer on said insulating pattern and said third impurity region.

6. A method as set forth in claim 5, wherein said gate electrode forming step forms a plurality of floating gate electrodes and a plurality of control gate electrodes over said floating gate electrodes.

7. A method for manufacturing a BiMOS device, comprising the steps of:

forming a gate electrode over a semiconductor substrate of a first conductivity type;

forming a photoresist pattern on said semiconductor substrate adjacent to said gate electrode;

introducing first impurities of a second conductivity type opposite to said first conductivity type with a mask of said gate electrode and said photoresist pattern to form a first impurity region within said semiconductor substrate;

forming an insulating pattern on said gate electrode and said first impurity region;

introducing second impurities of said second conductivity type into said semiconductor substrate with a mask of said insulating pattern to form a second impurity region within said semiconductor substrate, a junction depth of said second impurity region being larger than a junction depth of said first impurity region;

introducing third impurities of said first conductivity type into said semiconductor substrate with a mask of said insulating pattern to form a third impurity region within said semiconductor substrate; and forming a conductive layer on said insulating pattern and said third impurity region.

8. A method for manufacturing a BiMOS device, comprising the steps of:

forming a gate electrode over a semiconductor substrate of a first conductivity type;

introducing first impurities of a second conductivity type opposite to said first conductivity type with a mask of said gate electrode to form a first impurity regions within said semiconductor substrate;

forming an insulating pattern on said gate electrode and said first impurity region;

introducing second impurities of said second conductivity type into said semiconductor substrate with a mask of said insulating pattern to form a second impurity region within said semiconductor substrate, a junction depth of said second impurity region being larger than a junction depth of said first impurity region;

forming a trench in said second impurity region in self-alignment with said insulating pattern, a depth of said trench being larger than a depth of said first impurity region and smaller than depth of said second impurity region;

forming a sidewall insulating layer on a sidewall of said second impurity region at said trench;

introducing third impurities of said first conductivity type into said semiconductor substrate with a mask of said insulating pattern and said sidewall insulating layer to form a third impurity region within said semiconductor substrate; and forming a conductive layer on said insulating pattern and said third impurity region.

9. A method for manufacturing a BiMOS device, comprising the steps of:

forming a gate electrode over a semiconductor substrate of a first conductivity type;

introducing first impurities of a second conductivity type opposite to said first conductivity type with a mask of said gate electrode to form a first impurity region within said semiconductor substrate;

forming an insulating pattern on said gate electrode and said first impurity region;

forming a trench in said second impurity region in self-alignment with said insulating pattern, a depth of said trench being larger than a depth of said first impurity region;

introducing second impurities of said second conductivity type into said semiconductor substrate with a mask of said insulating pattern to form a second impurity region within said semiconductor substrate, a junction depth of said second impurity region being larger than a depth of said trench;

forming a sidewall insulating layer on a sidewall of said second impurity region at said trench;

introducing third impurities of said first conductivity type into said semiconductor substrate with a mask of said insulating pattern and said sidewall insulating layer to form a third impurity region within said semiconductor substrate; and forming a conductive layer on said insulating pattern and said third impurity region.

* * * * *